(12) United States Patent
Gao

(10) Patent No.: US 8,670,469 B2
(45) Date of Patent: Mar. 11, 2014

(54) TUNABLE LASER

(71) Applicant: Tianjin GP Photonics, Inc., Tianjin (CN)

(72) Inventor: Peiliang Gao, Tianjin (CN)

(73) Assignee: GP Photonics, Inc., Tianjin (CN)

( * ) Notice: Subject to any disclaimer, the term of this patent is extended or adjusted under 35 U.S.C. 154(b) by 0 days.

(21) Appl. No.: 13/655,424

(22) Filed: Oct. 18, 2012

(65) Prior Publication Data

US 2013/0039371 A1 Feb. 14, 2013

Related U.S. Application Data

(63) Continuation-in-part of application No. PCT/CN2010/072617, filed on May 11, 2010.

(30) Foreign Application Priority Data

Apr. 28, 2010 (CN) .......................... 2010 1 0158058

(51) Int. Cl.
*H01S 3/117* (2006.01)
(52) U.S. Cl.
USPC ............................................................ 372/13
(58) Field of Classification Search
USPC .................. 398/65, 83, 140; 372/20
See application file for complete search history.

(56) References Cited

U.S. PATENT DOCUMENTS 5,452,313 A * 9/1995 Fink ................................ 372/13

* cited by examiner

*Primary Examiner* — Jessica Stultz
*Assistant Examiner* — Tuan Nguyen
(74) *Attorney, Agent, or Firm* — Matthias Scholl P.C.; Matthias Scholl

(57) ABSTRACT

A tunable laser, including: a laser resonant cavity including first and second total reflection mirrors within a laser spectral range; first and second wavelength-adjustable laser gain mediums disposed in the laser resonant cavity; first and second intra-cavity collimating lenses; an acousto-optic tunable filter; a device exciting sound waves in an acousto-optic crystal and including a sound wave energy transducer bonded on a selected surface of the crystal; a radio frequency signal source; an optical phase modulator; an optical etalon disposed between the optical phase modulator and the laser gain medium; a wavelength locker disposed at one of zero-order diffraction optical paths of intra-cavity light; a pigtailed collimator coupling laser output light to an optical fiber; first and second pumping devices exciting the first and second laser gain mediums respectively; an optical phase modulator driver for driving the phase modulator; and a signal control processing circuit.

12 Claims, 6 Drawing Sheets

TUNABLE LASER

CROSS-REFERENCE TO RELATED APPLICATIONS

This application is a continuation-in-part of International Patent Application No. PCT/CN2010/072617 with an international filing date of May 11, 2010, designating the United States, now pending, and further claims priority benefits to Chinese Patent Application No. 201010158058.0 filed Apr. 28, 2010. The contents of all the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention belongs to the field of optical fiber communication, and more particularly to a high performance tunable laser with high speed tuning, stable wavelength, and power output.

2. Description of the Related Art

Currently, fiber optical telecommunication is employed in most modern telecommunication systems. Fiber optical network has offered unprecedented large capacity and installation flexibility and is able to support a variety of broadband applications that are under unprecedented development. Broadband tunable laser can help utilize the present fiber optical network resources more efficiently. Data traffic flow can be transferred from a congested channel to an unused channel by means of dynamic provision of a broadband network, thus Internet requirements are met. Tunable laser, which is also an important precondition for implementing a dynamic fiber optical network, is capable of establishing or changing an optical path rapidly. Tunable laser, especially the tunable laser with small size, large tuning range and high power output, has also been widely used in the fields of biology, medical apparatus and fiber sensor network, etc.

In view of these applications, an ideal tunable laser should include the following characteristics: wide tunable range, i.e. covering waveband C and (or) waveband L (approximately 1530 nanometers to 1610 nanometers); small size; fast channel switching speed (faster than 1 millisecond) between frequency interval grids of any two International Telecommunication Unions (ITU); excellent long-term performance stability (service time over 25 years); high reliability under extreme working conditions; and low power consumption and low cost for volume production.

Conventional tunable lasers falls into three types: (1) system that uses mechanical movable components, e.g. diffraction grating, prism, etalon or MEMS (Micro Electronic Mechanical System), as wavelength adjusting unit, the problem with this technology is as follows: the technology of adjusting wavelength by mechanically adjusting grating or prism angle is extraordinarily poor in resistance to mechanical shock and vibration, which can cause unstable short-term and long-term performances, and as a result, the tunable filter with movable components is unsuitable to fiber optical communication. (2) system for tuning wavelength by temperature adjustment through component heating or cooling. The problem with this technology is the low tuning speed due to its inherent characteristics of temperature tuning, so the application of such a laser is limited. (3) system that uses non-moving optical devices in the cavity for wavelength adjustment, including the use of magneto-optic device, acousto-optic device or electro-optic device, or current injection for selecting wavelength. The advantages of using acousto-optic technology includes high speed wavelength tuning by means of electric control without moving component, wide tuning range and simple structure, etc., therefore, such a system provides a viable solution for tunable lasers that meets the strict application requirements for fiber optical communication system.

SUMMARY OF THE INVENTION

In view of the above-described problems, it is one objective of the invention to provide a tunable laser with quick tuning, low intra-cavity loss, and high and stable power output.

To achieve the above objective, in accordance with one embodiment of the invention, there is provided a tunable laser comprising:

a laser resonant cavity comprising first and second total reflection mirrors within a laser spectral range;

first and second wavelength-adjustable laser gain mediums disposed in the laser resonant cavity and carrying out laser oscillation in a specified laser wavelength range;

first and second intra-cavity collimating lenses;

an acousto-optic tunable filter disposed in the laser resonant cavity, light beam emitted from the first laser gain medium being collimated by the first intra-cavity collimating lens and then input into the acousto-optic tunable filter at a Bragg angle; light beam emitted from the second laser gain medium being collimated by the second intra-cavity collimating lens and then input into the acousto-optic tunable filter at the Bragg angle;

a device exciting sound waves in an acousto-optic crystal and comprising a sound wave energy transducer bonded on a selected surface of the crystal; the acousto-optic tunable filter, the two reflection mirrors and the two laser gain media being disposed in such a manner that laser oscillation is formed in the laser resonant cavity only by a first order diffracted beam of the acousto-optic tunable filter;

a radio frequency signal source providing radio frequency energy for the energy transducer and adjusting the oscillation wavelength of the laser resonant cavity by changing the radio frequency;

an optical phase modulator disposed between one of the intra-cavity collimating lenses and the acousto-optic crystal;

an optical etalon disposed between the optical phase modulator and the laser gain medium;

a wavelength locker disposed at one of zero-order diffraction optical paths of intra-cavity light;

a pigtailed collimator coupling laser output light to an optical fiber;

first and second pumping devices exciting the first and second laser gain mediums respectively;

an optical phase modulator driver for driving the phase modulator; and a signal control processing circuit.

In a class of this embodiment, the acousto-optic tunable filter is disposed at a position for forming a Bragg angle with respect to collimated beams emitted from the laser gain medium and maintains laser beams for different wavelengths at the Bragg angle.

In a class of this embodiment, the first and second laser cavity mirrors are a plane mirror, a convex mirror, a concave mirror, or a combination thereof.

In a class of this embodiment, the optical etalon has a free spectral range of 25 GHz, 50 GHz, or 100 GHz.

In a class of this embodiment, the optical phase modulator is an electro-optical phase modulator, or a physical optics effect-based optical phase modulator in other forms.

In a class of this embodiment, the wavelength locker comprises a beam splitter disposed in one of the zero-order diffraction optical paths of intra-cavity light and at 45-degree angle therewith; a first photoelectric detector for receiving reflective light from the beam splitter; an optical filter having wavelength-varying transmittance disposed between the beam splitter and a second photoelectric detector; and the second photoelectric detector for receiving an optical signal output from the optical filter having wavelength-varying transmittance.

In a class of this embodiment, the pigtailed collimator comprises a polarization maintaining fiber and a gradient index lens, or a single-mode fiber and a gradient index lens.

In a class of this embodiment, the acousto-optic tunable filter comprises an anisotropic birefringent acousto-optic crystal with optical spectrum characteristics conforming to laser spectral requirements.

In a class of this embodiment, the signal control processing circuit comprising a microprocessor; a first digital-to-analog converter connected to the microprocessor to control a first pumping source; a second digital-to-analog converter connected to the microprocessor to control the optical phase modulator driver; a third digital-to-analog converter connected to the microprocessor to control the radio frequency source; a fourth digital-to-analog converter connected to the microprocessor to control a second pumping source; a first analog-to-digital converter connected to the first photoelectric detector to detect laser power and input a signal to the microprocessor; and a second analog-to-digital converter connected to the second photoelectric detector to detect an optical signal output by the optical filter with adjustable transmittance, and feed the optical signal back to the microprocessor for laser wavelength control.

In a class of this embodiment, a ratio of reflectivity/transmittance of the beam splitter is 50%.

In a class of this embodiment, the optical filter having wavelength-varying transmittance is a multilayer dielectric thin film filter or an optical etalon.

In a class of this embodiment, the optical characteristics of the first photoelectric detector and the second photoelectric detector are matched with laser output spectrum.

Advantages of the invention are summarized below:

1. The tunable laser comprises two laser gain media, an acousto-optic tunable filter, a single radio frequency energy transducer, an optical phase modulator, and a signal control processing circuit based on a microprocessor. The wavelength precision and power stability of the laser output are determined by a wavelength locker and a power monitor and feedback control system; and different laser gain media, sound wave driving frequencies, and acousto-optic crystals can be used to meet the different requirements for a wide range of applications.
2. The tunable filter uses two laser gain media, thus high laser output power can be achieved.
3. The tunable laser is more suitable for volume production because the low cost acousto-optic filter with single energy transducer are used to reduce the system cost and improve the system simplicity for easy assembly and low manufacturing cost.
4. The tunable laser is designed to meet the requirements on sub-millisecond level tuning speed, small size and long term reliability in an extreme working environment for fiber optical telecommunication.

DETAILED DESCRIPTION OF THE EMBODIMENTS

For further illustrating the invention, experiments detailing a tunable laser are described below. It should be noted that the following examples are intended to describe and not to limit the invention.

The preferred embodiments of the tunable laser will be described in details below.

Figure 1:
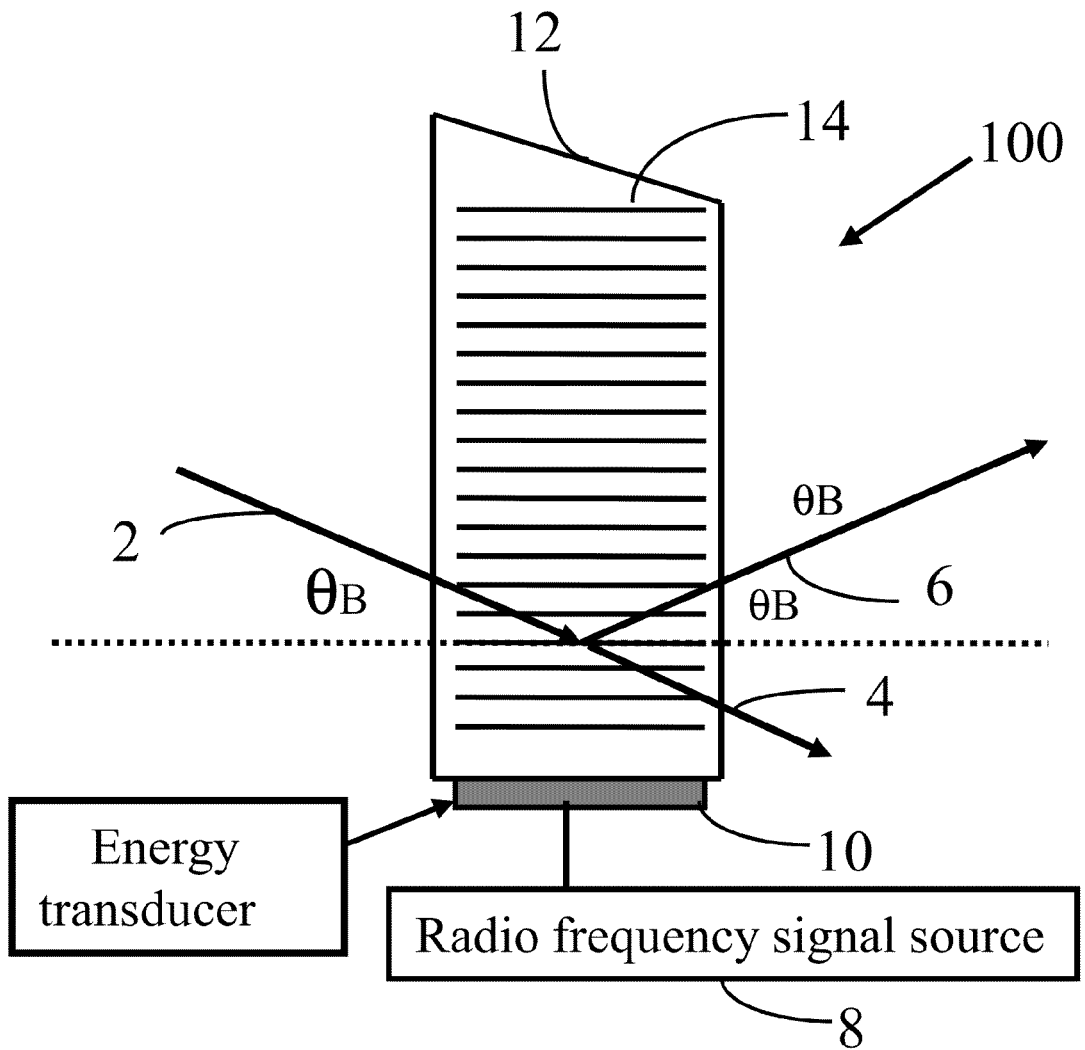
FIG. 1 shows a tunable filter that comprises an acousto-optic crystal with a single energy transducer and a radio frequency power source in accordance with one embodiment of the invention.

An acousto-optic tunable filter 100 is shown as FIG. 1. The acousto-optic tunable filter 100 comprises a radio frequency signal source 8, an acousto-optic energy transducer 10, and an acousto-optic crystal 12.

There are two types of acousto-optic tunable filter: collinear and non-collinear. The non-collinear type includes isotropic Bragg diffraction type and far-off axis anisotropic Bragg diffraction type. Of these, the far-off axis anisotropic Bragg diffraction has more practical application value due to its narrow diffraction bandwidth.

In one embodiment, the acousto-optic crystal 12 is an anisotropic birefringent crystal for its narrow diffraction bandwidth. A crystal satisfying these properties is tellurium dioxide ($TeO_2$), which has high optical uniformity and low light absorbency and has high optical power damage threshold when working in a shear mode. Thus, because of these advantages, $TeO_2$ has been widely used in many applications.

Other crystals, e.g. lithium niobate ($LiNbO_3$), calcium molybdate ($CaMoO_4$) or lead molybdenum oxide ($PbMoO_4$), are also often used as the materials for acousto-optic device. There are many factors that have an influence on the selection for particular crystals, and only a few factors are given below, for example: the type of the acousto-optic device, whether high-quality crystal is commercially available, and application conditions and requirement, e.g. diffraction efficiency, power loss, separation angle of incident light and diffraction light, and the size of the device, etc.

For applications in 100 GHz or 50 GHz dense wavelength division multiplexing (DWDM) fiber optical telecommunication (the C and L band wavelength range is approximately from 1530 nanometers to 1610 nanometers), the tunable filter 100 is a non-collinear, fax-off axis Bragg diffraction type working in shear mode. In one embodiment, when far-off axis anisotropic Bragg diffraction exceeds certain frequency, the Bragg angle of an incident angle is suddenly increased and filter bandwidth also becomes narrower.

This type of Bragg diffraction is usually used for a narrow-band filter. The use of tellurium dioxide (TeO$_2$) as crystal material is only based on the following consideration and does not limit the use of other crystals: tellurium dioxide has low sound wave velocity, acoustically anisotropic property and optically birefringent property. The crystals that are usually used for manufacturing acousto-optic tunable filter (AOTF) include lithium niobate (LiNbO$_3$), calcium molybdate (CaMoO$_4$) and tellurium dioxide (TeO$_2$). In the case of TeO$_2$, the transmission velocity of sound wave in a nonlinear mode is 0.6*105 cm/sec. In the case of LiNbO$_3$, the transmission velocity of sound wave in a collinear mode is 6.57*105 cm/sec. And in the case of CaMoO$_4$, the transmission velocity of sound wave in a collinear mode is 6.0*105 cm/sec.

The energy transducer 10 is bonded to the acousto-optic crystal. In one embodiment, the energy transducer 10 is bonded to a selected side of the TeO$_2$ crystal, and the opposite side to the transducer is usually cut by a small angle to reduce the interference of reflected sound wave with the forward traveling sound wave, thereby enhancing performance stability.

The radio frequency signal source 8 transmits a sound wave 14 to the acousto-optic crystal 12 through the energy transducer 10. The radiofrequency range used in many applications ranges from a few megahertz to hundreds of megahertz.

In practical operation, a light beam 2 enters the acousto-optic crystal 12 (acousto-optic crystal) at a Bragg angle, $\Theta i = \Theta B$, namely, the incident angle is equal to the Bragg angle. The Bragg angle can be computed using the formula below: $\sin \Theta B = \lambda_0 / (2 n \Lambda)$, wherein $\lambda_0$ is the wavelength of the incident light, n is mean refractive index of the acousto-optic crystal, and $\Lambda$ is the wavelength of the sound wave. The sound wave 14 generated by the energy transducer enables the light beam 2 to be diffracted as a first-order diffraction light beam 6 with an output angle $\Theta B$, and a zero-order diffraction light 4 having the same direction as the incident light beam 2. Thus, output wavelength can be selected by changing the frequency of the signal source 8.

Figure 2:
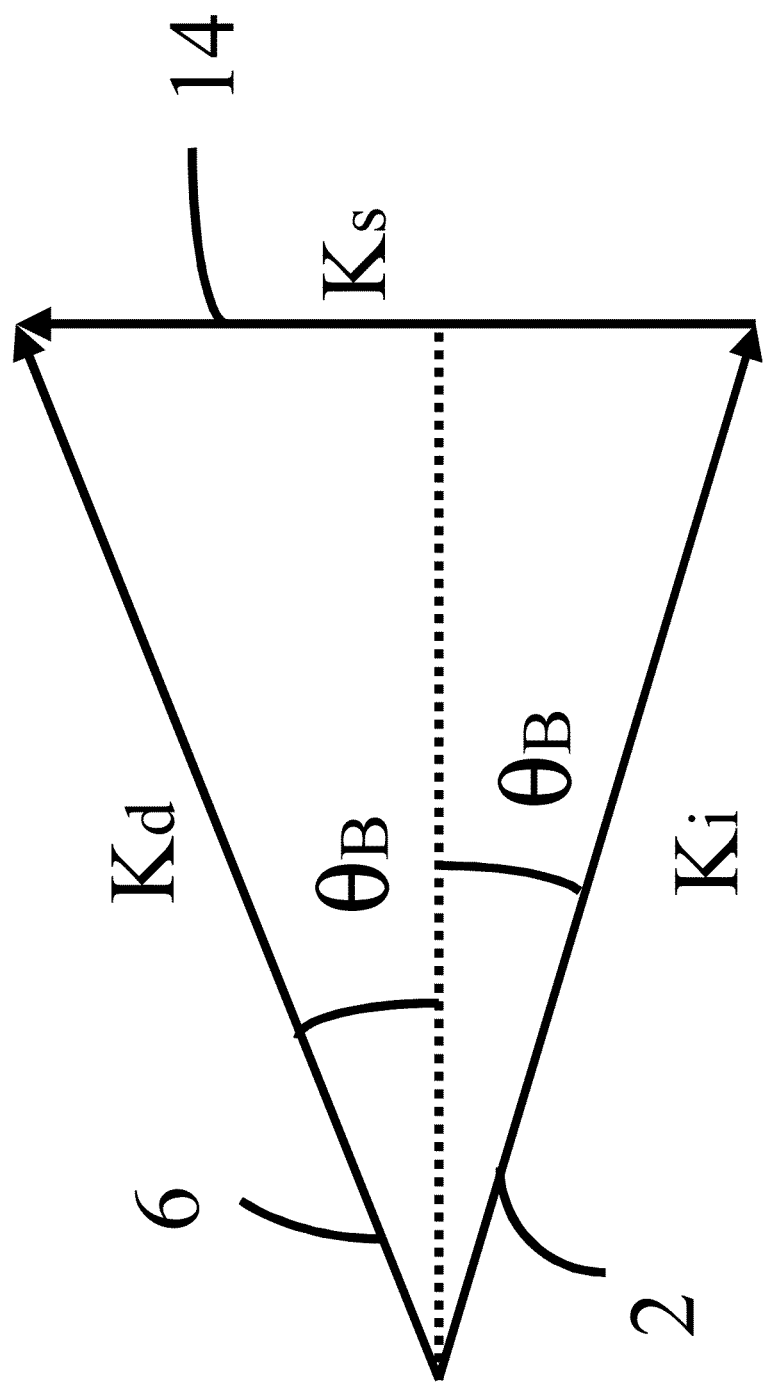
FIG. 2 shows wave vector relations of an incident light entering an acousto-optic filter at Bragg angle, a diffracted light, and a sound wave.

FIG. 2 shows the wave vector relation of an incident light beam 2 ($\kappa 2$), a diffraction light beam 6 ($\kappa 6$) and a sound wave (Ks) as below: $\kappa 2 + \kappa s = \kappa 6$, and the sound wave leads to upward shift of the frequency of the diffracted light.

Figure 3:
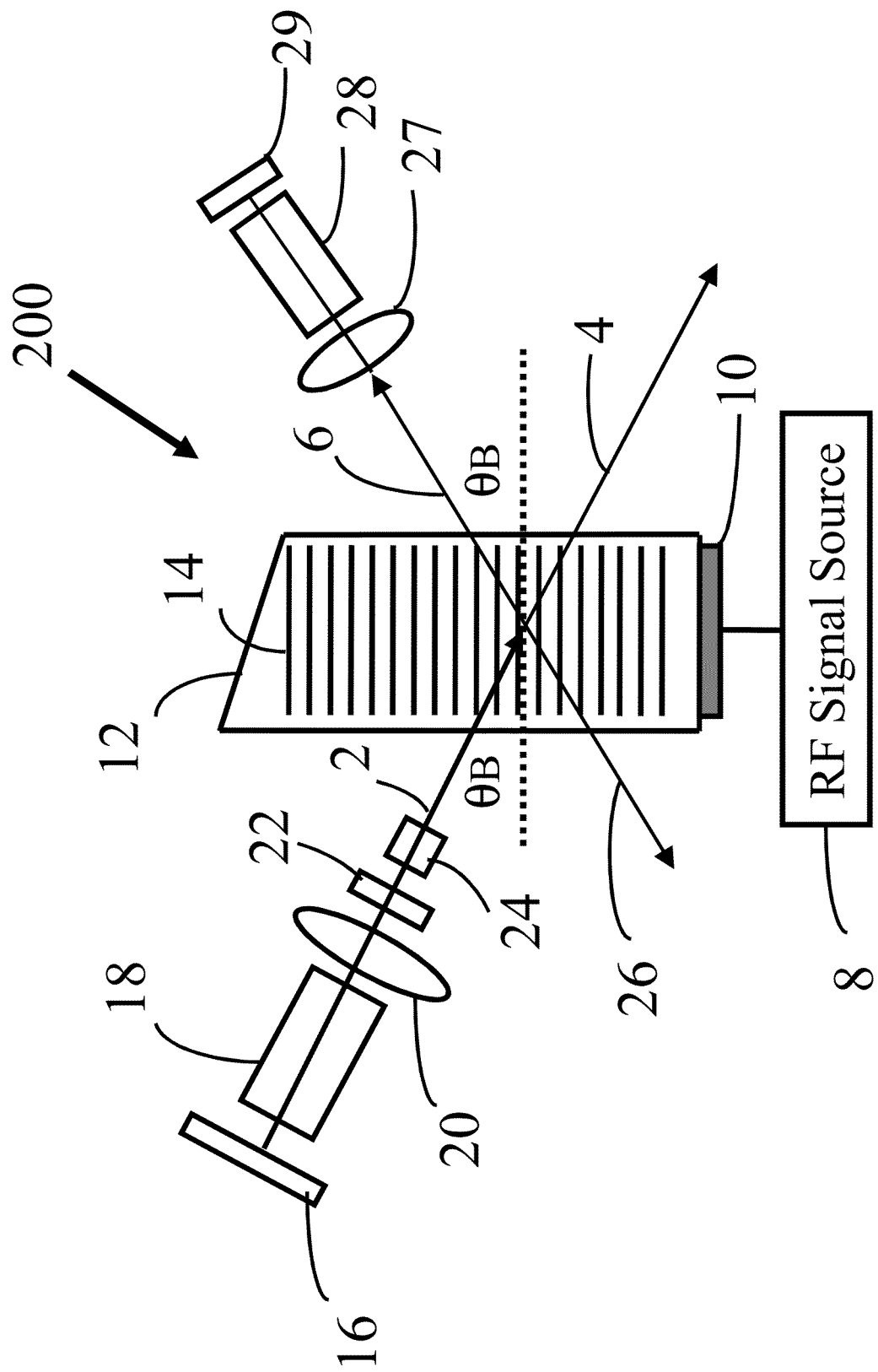
FIG. 3 is a schematic plan view of a tunable laser.

FIG. 3 shows one embodiment of the tunable laser 200. The tunable laser 200 uses an acousto-optic tunable filter (AOTF) 100 as a tunable filter. A laser resonant cavity comprises two cavity mirrors 16 and 29 with total reflectivity (i.e. 100% reflectivity).

Typically, the reflectivity of laser mirrors differs according to different wavelengths or color lights, and the reflectivity here is corresponding to the output wavelength bandwidth of the laser. The purpose of the cavity mirrors is to provide so-called 'positive feedback' for the laser resonant cavity.

Optically reflective multilayer dielectric thin films can be plated on laser gain medium directly to avoid the use of a separate mirror, and this is particularly common in semiconductor gain medium. Laser cavities formed by two flat mirrors are called Fabry-Perot cavity or plane parallel cavity, also known as 'critical stable laser resonant cavity', which generates a zigzag-shaped optical path. This resonant cavity is very sensitive to the mechanical vibration as well as off-axis light.

Two other laser resonant cavities are unstable cavity and stable cavity. The unstable laser resonant cavity uses convex mirror or the combination of convex mirror and plane mirror. The stable laser resonant cavity uses concave mirror or the combination of concave mirror and plane mirror. Depending on the different applications, different laser resonant cavities can be used for meeting different requirements on laser output power, beam size and laser mode.

The first laser gain medium 18 and second laser gain medium 29, shown in FIG. 3, are disposed between two total reflection cavity mirrors. Light emitted from the laser gain medium is provided with positive feedback by cavity mirrors and is further amplified. Any laser gain medium that laser oscillation can be amplified in the laser resonant cavity may be selected.

In the disclosed embodiment for fiber optical telecommunication application, a semiconductor gain chip is used as the laser gain media and its lasing mechanism is based upon the recombination of light-excited PN junction hole and free electrons. Light emitted from the semiconductor gain medium can be described by limited distribution of photon energy that takes the forbidden bandwidth of the material in active region of semiconductor amplifier.

Light beams emitted from laser gain medium 18 and light beam emitted from laser gain medium 28 are collimated by the first intra-cavity collimating lens 20 and the second intra-cavity collimating lens 27 respectively. It is very important to reduce the divergence of incident light beam before entering crystal 12 because the divergence of diffracted light by the acousto-optical filter is directly affected by the divergence of incident light and is crucial to the laser operating performance.

The acousto-optic tunable filter 100 is disposed between the first intra-cavity collimating lens 20 and the second intra-cavity collimating lens 27 with collimated light beams 2 and 6 from the laser gain medium 18 and 28 entering the filter 100 at Bragg angle and lasing modes are amplified by the resonant cavity through the first order Bragg diffraction by tunable filter 100. Laser cavity mode phase matching is achieved for different wavelengths by changing the frequency of radio frequency (RF) signal source 8 and an optical phase modulator 22. It is noteworthy that, a lead zirconate titanate (PZT) base can also be used for laser cavity phase matching purpose. When driven by an electrical voltage, a PZT base on which a cavity mirror is bonded can move the cavity mirror and change the laser cavity length. In one embodiment, the phase modulator 22 is a photoelectric modulator. Theoretically, the phase modulator 22 can be disposed at any position in the laser resonant cavity only if it is spatially feasible. To obtain the best performance, the phase modulator 22 should be disposed at the position in the laser resonant cavity that has minimal laser cavity beam divergence. In a laser system 200 shown as FIG. 3, the phase modulator 22 is disposed between the first intra-cavity collimating lens 20 and the acousto-optic crystal 12.

Lights beam 4 and 26 are the zero-order diffraction lights corresponding to the intra-cavity lights beam 2 and 6, and 'leak' from the laser resonant cavity in the process of laser oscillation. These two 'leaking' lights may be both used as laser output. In practical application, only one of these two light beams is used for laser output, while the other one is generally treated as the loss of the laser resonant cavity, or may be used for laser power monitoring and wavelength locking purpose. The way of using these 'leaking' lights for laser power monitoring and wavelength locking will be described in details hereinafter.

An optical etalon with high fineness is needed to establish optical frequency adjustment interval and reduce the spectrum width of laser mode in the application for DWDM fiber optical telecommunication network, the interval between two channels is 25 GHz or 50 GHz or 100 GHz. In the embodiment shown in FIG. 3, an optical etalon 24 having a free spectral range of 25 GHz, or 50 GHz or 100 GHz is disposed between the optical phase modulator 22 and the acousto-optic crystal 12.

Figure 4:
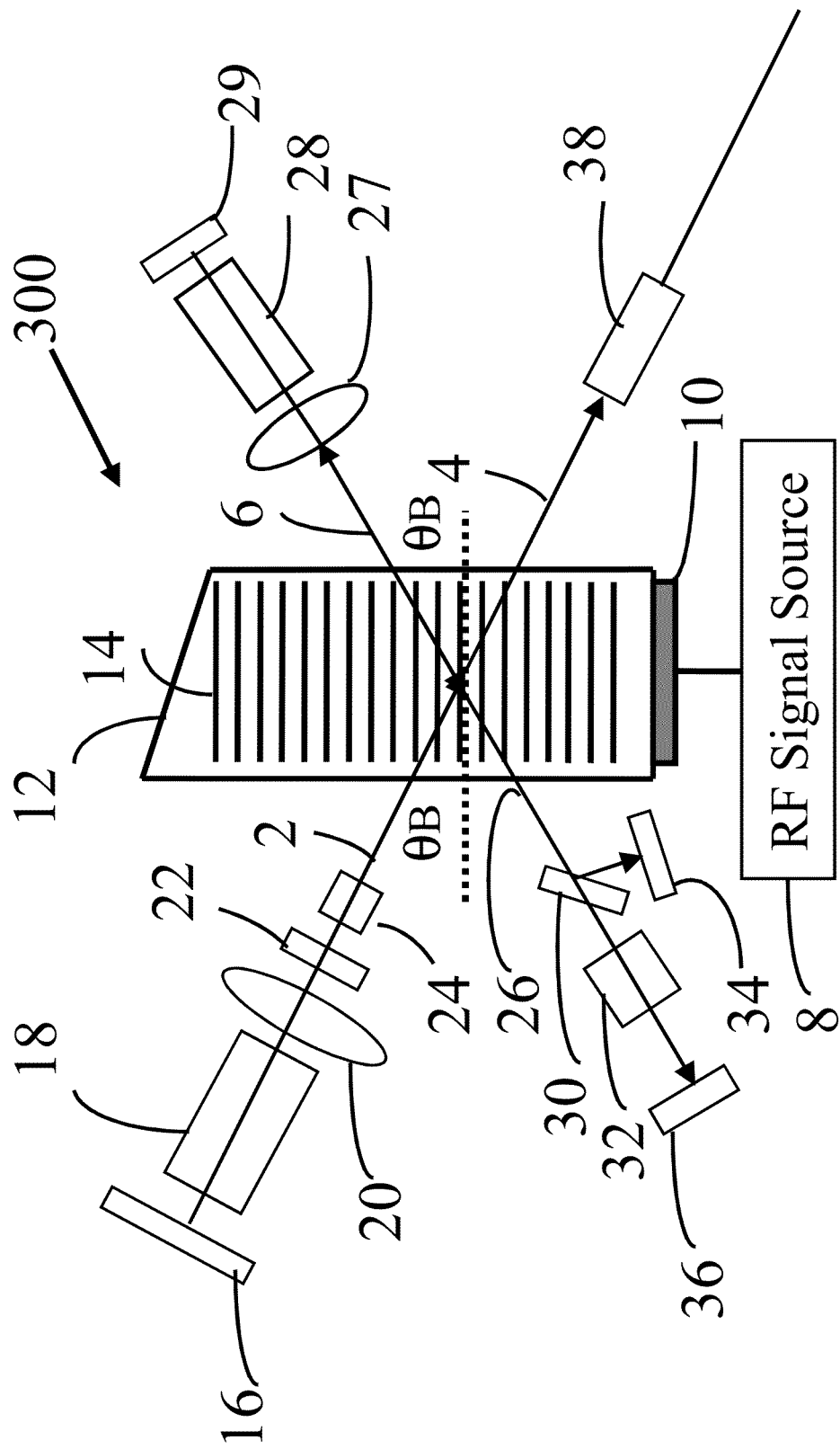
FIG. 4 is a schematic plan view of a tunable laser that comprises a power monitoring and wavelength locking unit.

One embodiment of the tunable laser shown as FIG. 4, the tunable laser 300 is provided with a wavelength locker and a pigtailed collimator to couple the laser output power to an optical fiber. In this application, collimator 38 uses polarization maintaining (PM) fiber. If the polarization state of laser output does not need to be maintained, other types of fiber, such as single mode fiber, may be used.

The wavelength locker is disposed along the light beam 26 outside of the laser cavity to avoid the 'insertion loss' of any excessive optical components inside the laser resonant cavity. The wavelength locker comprises a beam splitter 30, photoelectric detectors 34 and 36 and an optical filter 32 having wavelength-varying transmittance. The light beam 26 is the zero-order diffracted cavity light by acousto-optical filter 100. The beam splitter 30 has the 50% ration of reflectivity/transmittance and is used to reflect part of the light beam 26 to the photoelectric detector 34. The optical filter 32 is disposed between the beam splitter 30 and the photoelectric detector 36. The photoelectric detector 36 is used for monitoring power change that results from the change of laser wavelength.

The laser output light beam 4 is coupled to an optical fiber by the fiber pigtailed collimator 38. If the polarization state of output laser needs to be maintained, polarization maintaining fiber needs to be used, otherwise, a single mode fiber can be used for collimator 38.

Multilayer dielectric thin film filter and low fineness etalon are often used as optical filter. In one embodiment, the optical filter 32 uses a multilayer dielectric thin film filter. In another embodiment, the optical filter 32 uses a low fineness optical etalon with the same free spectrum range as etalon 24. Both the thin film filter and the low fineness optical etalon can be designed and mass produced at low cost.

Figure 5:
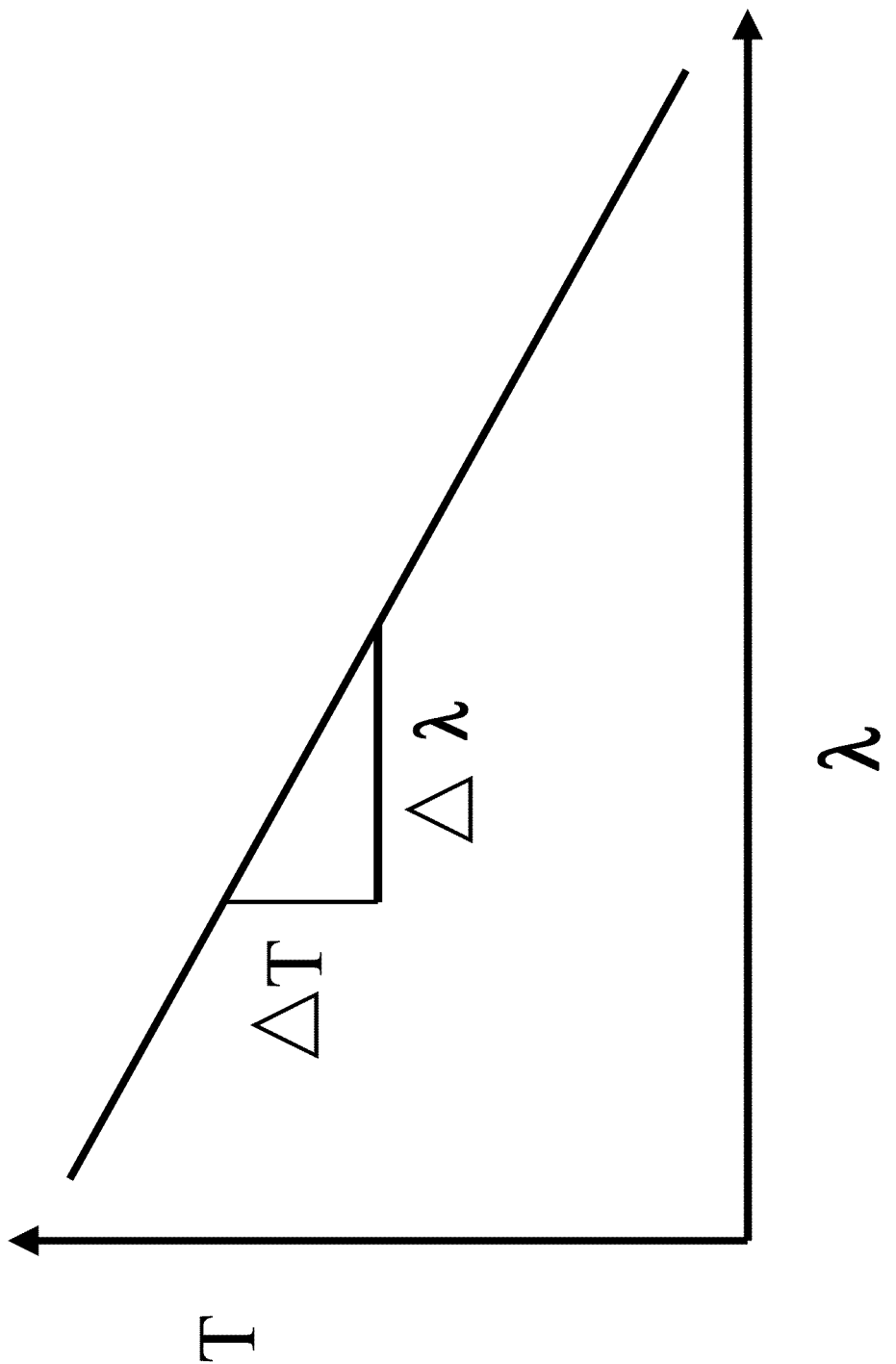
FIG. 5 shows a linear relation or an approximately linear relation between power transmission and wavelength by a low fineness etalon or a multilayer dielectric thin film filter for wavelength locking.

FIG. 5 shows the relation between wavelength ($\lambda$) and light transmittance (T) of the optical filter 32. The relation between wavelength and transmittance of the optical filter 32 can be expressed by the following formula: $\lambda=\alpha T+\beta$, wherein $\alpha$ and $\beta$ are determined by insertion loss and slope that is generated by linear fitting of wavelength vs transmittance. The numerical value of a may be designed based on different application conditions, wavelength ranges and wavelength locking accuracy requirements.

The power received by the photoelectric detector 36 is directly proportional to the transmittance T, so the relation between the wavelength $\lambda$ and the power P received can be expressed as: $\lambda=\alpha P+\beta$, and can be further expressed as: $\Delta\lambda=\alpha\Delta P$. Assuming that the laser resonant cavity power keeps unchanged, power change ($\Delta P$) detected by the photoelectric detector 36 is only caused by wavelength change ($\Delta\lambda$). Laser wavelength can be 'pulled back' to a designated wavelength by changing the signal frequency of the radio frequency (RF) signal source 8, and/or changing the phase of the laser resonant cavity via the phase modulator when the power change signal due to wavelength variation is fed back to a closed feedback control loop. During normal operation of the tunable laser 300, laser power can be monitored accurately by the photoelectric detector 34, and the laser power signal from detector 34 can be used in a closed feedback control loop to monitor and maintain stable laser power output.

Figure 6:
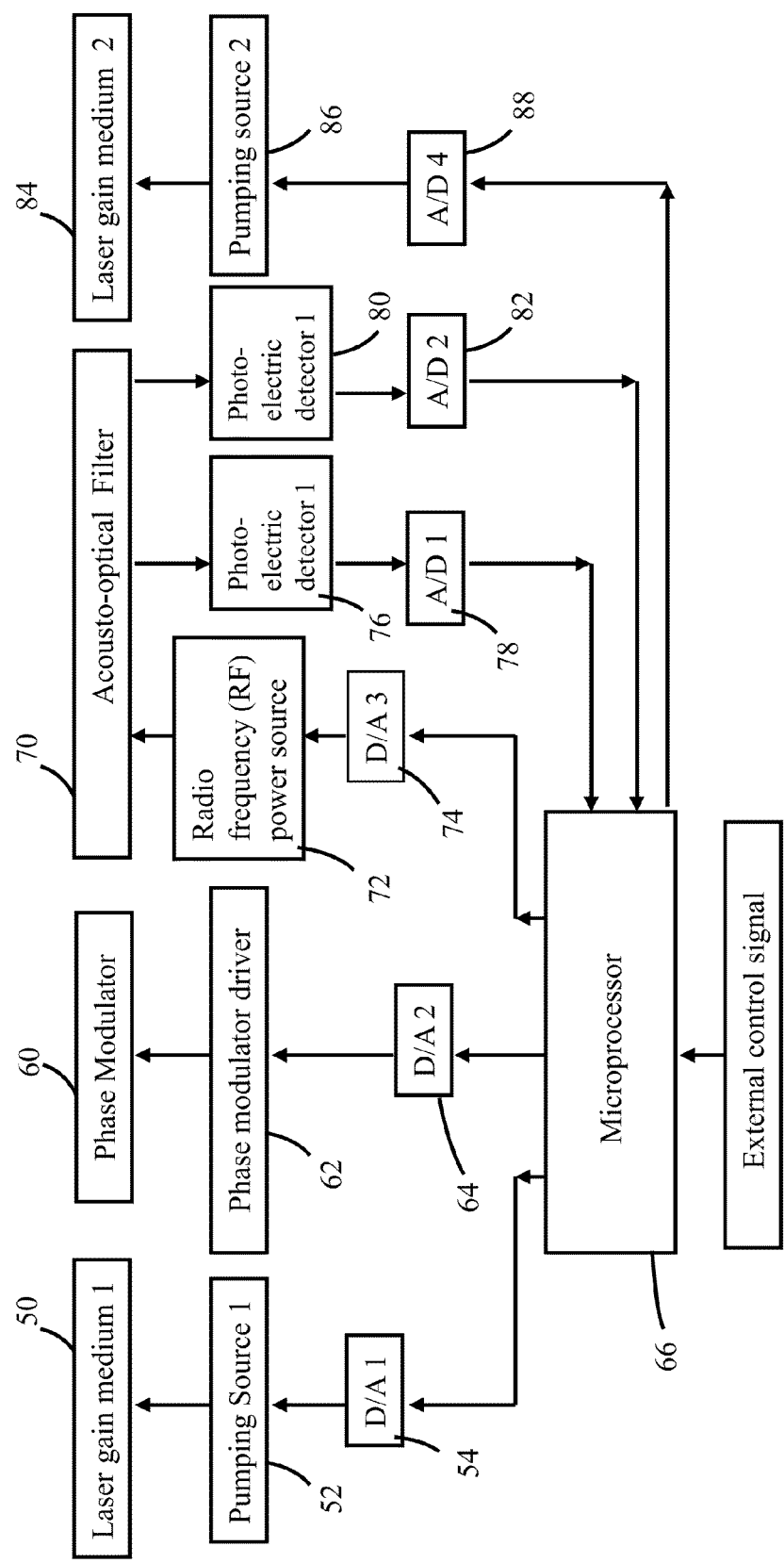
FIG. 6 is a functional block diagram of a signal control processing circuit.

The signal control processing circuit of the tunable laser 300 is shown in FIG. 6. In the signal control processing circuit, a central control unit is a microprocessor 66 with embedded software program with several closed feedback control loops for power and wavelength controlling and monitoring. The microprocessor 66 receives signals from photoelectric detectors 76 and 80 via analog-to-digital conversion (A/D) devices 78 and 82, and these signals include the information of laser output power and wavelength shift. The information is processed by the program embedded in the microprocessor 66. The microprocessor 66 sends signals via digital-to-analog (D/A) devices 74, 64, 54, and 88 to control a radio frequency (RF) power source 72 driving the acousto-optic filter 70, control the phase modulator driver 62 for the phase modulator 60, and control pumping sources 52 and 86 to adjust the gain of gain medium media 50 and 84 respectively, in order to adjust the frequency of radio frequency signal source, laser phase matching conditions and pumping power. In this way, in the case of frequency shift, and/or optical wavelength shift, or in the case of the reception of an external instruction for changing laser wavelength and/or power, stable laser output power and the designated wavelength of the laser output can be realized.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:
1. A tunable laser, comprising:
a) a laser resonant cavity comprising first and second total reflection mirrors within a laser spectral range;
b) first and second wavelength-adjustable laser gain mediums disposed in the laser resonant cavity and carrying out laser oscillation in a specified laser wavelength range;
c) first and second intra-cavity collimating lenses;
d) an acousto-optic tunable filter disposed in the laser resonant cavity, light beam emitted from the first laser gain medium being collimated by the first intra-cavity collimating lens and then input into the acousto-optic tunable filter at a Bragg angle; light beam emitted from the second laser gain medium being collimated by the second intra-cavity collimating lens and then input into the acousto-optic tunable filter at the Bragg angle;
e) a device exciting sound waves in an acousto-optic crystal and comprising a sound wave energy transducer bonded on a selected surface of the crystal; the acousto-optic tunable filter, the two reflection mirrors and the two laser gain media being disposed in such a manner that laser oscillation is formed in the laser resonant cavity only by a first order diffracted beam of the acousto-optic tunable filter;
f) a radio frequency signal source providing radio frequency energy for the energy transducer and adjusting the oscillation wavelength of the laser resonant cavity by changing the radio frequency;
g) an optical phase modulator disposed between one of the intra-cavity collimating lenses and the acousto-optic crystal;
h) an optical etalon disposed between the optical phase modulator and the laser gain medium;
i) a wavelength locker disposed at one of zero-order diffraction optical paths of intra-cavity light;
j) a pigtailed collimator coupling laser output light to an optical fiber;
k) first and second pumping devices exciting the first and second laser gain mediums respectively;

l) an optical phase modulator driver for driving the phase modulator; and m) a signal control processing circuit.

2. The tunable laser of claim 1, wherein the acousto-optic tunable filter is disposed at a position for forming a Bragg angle with respect to collimated beams emitted from the laser gain medium and maintains laser beams for different wavelengths at the Bragg angle.

3. The tunable laser of claim 1, wherein the first and second laser cavity mirrors are a plane mirror, a convex mirror, a concave mirror, or a combination thereof.

4. The tunable laser of claim 1, wherein the optical etalon has a free spectral range of 25 GHz, 50 GHz, or 100 GHz.

5. The tunable laser of claim 1, wherein the optical phase modulator is an electro-optical phase modulator, or a physical optics effect-based optical phase modulator in other forms.

6. The tunable laser of claim 1, wherein the wavelength locker comprises a beam splitter disposed in one of the zero-order diffraction optical paths of intra-cavity light and at 45-degree angle therewith; a first photoelectric detector for receiving reflective light from the beam splitter; an optical filter having wavelength-varying transmittance disposed between the beam splitter and a second photoelectric detector; and the second photoelectric detector for receiving an optical signal output from the optical filter having wavelength-varying transmittance.

7. The tunable laser of claim 6, comprises:

a) a microprocessor;

b) a first digital-to-analog converter connected to the microprocessor to control a first pumping source;

c) a second digital-to-analog converter connected to the microprocessor to control the optical phase modulator driver;

d) a third digital-to-analog converter connected to the microprocessor to control a radio frequency source;

e) a fourth digital-to-analog converter connected to the microprocessor to control a second pumping source;

f) a first analog-to-digital converter connected to the first photoelectric detector to detect laser power and input a signal to the microprocessor; and g) a second analog-to-digital converter connected to the second photoelectric detector to detect an optical signal output by the optical filter with variable transmittance, and feed the optical signal back to the microprocessor for laser wavelength control.

8. The tunable laser of claim 6, wherein a ratio of reflectivity/transmittance of the beam splitter is 50%.

9. The tunable laser of claim 6, wherein the optical filter having wavelength-varying transmittance is a multilayer dielectric thin film filter or an optical etalon.

10. The tunable laser of claim 6, wherein the optical characteristics of the first photoelectric detector and the second photoelectric detector are matched with laser output spectrum.

11. The tunable laser of claim 1, wherein the pigtailed collimator comprises a polarization maintaining fiber and a gradient index lens, or a single-mode fiber and a gradient index lens.

12. The tunable laser of claim 1, wherein the acousto-optic tunable filter comprises an anisotropic birefringent acousto-optic crystal with optical spectrum characteristics conforming to laser spectral requirements.

* * * * *